(12) United States Patent
Li et al.

(10) Patent No.: US 11,417,824 B2
(45) Date of Patent: Aug. 16, 2022

(54) SENSOR MODULE

(71) Applicant: KABUSHIKI KAISHA TOSHIBA, Tokyo (JP)

(72) Inventors: Yongfang Li, Kawasaki Kanagawa (JP); Takahiro Omori, Kawasaki Kanagawa (JP); Takashi Usui, Saitama Saitama (JP); Osamu Nishimura, Kawasaki Kanagawa (JP); Kazuo Watabe, Yokohama Kanagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 418 days.

(21) Appl. No.: 16/556,277

(22) Filed: Aug. 30, 2019

(65) Prior Publication Data

US 2020/0295250 A1 Sep. 17, 2020

(30) Foreign Application Priority Data

Mar. 15, 2019 (JP) .............................. JP2019-048212

(51) Int. Cl.
*H01L 41/04* (2006.01)
*H01L 41/047* (2006.01)
(Continued)

(52) U.S. Cl.
CPC ..... *H01L 41/0472* (2013.01); *H03H 9/02244* (2013.01); *H03H 21/0007* (2013.01)

(58) Field of Classification Search
CPC ............ H01L 41/0472; H03H 9/02244; H03H 21/0007
See application file for complete search history.

(56) References Cited

U.S. PATENT DOCUMENTS

2001/0050801 A1* 12/2001 Behin ................ G02B 26/0866
359/298
2008/0264170 A1* 10/2008 Abbott ................ G01N 29/022
73/590
(Continued)

FOREIGN PATENT DOCUMENTS

EP 0 849 574 A2 6/1998
JP H10-157257 A 6/1998
(Continued)

OTHER PUBLICATIONS

Okada et al., "A digital output accelerometer using an array of patterned PZT thin films electrically connected in series." 23$^{rd}$ Proceeding of JIEP Annual Meeting Session ID: 13A-11 (2009), pp. 1-2.

(Continued)

*Primary Examiner* — J. San Martin
(74) *Attorney, Agent, or Firm* — Finnegan, Henderson, Farabow, Garrett & Dunner L.L.P.

(57) ABSTRACT

According to one embodiment, a sensor module includes at least one sensor and at least one switch. The sensor includes a first piezoelectric element. The first piezoelectric element includes a first electrode. The first piezoelectric element is set with a resonance frequency to resonate at a vibration frequency of a detection target. The switch includes a second piezoelectric element. The second piezoelectric element includes a second electrode connected to the first electrode and a third electrode electrically separated from the second electrode.

11 Claims, 5 Drawing Sheets

(51) Int. Cl.
*H03H 21/00* (2006.01)
*H03H 9/02* (2006.01)

(56) References Cited

U.S. PATENT DOCUMENTS

2014/0232241 A1   8/2014  Hajati
2017/0148592 A1*  5/2017  Tabib-Azir .......... H01L 41/1132
2019/0360880 A1  11/2019  Li

FOREIGN PATENT DOCUMENTS

JP    2016-513408 A    5/2016
JP    2018-190053 A   11/2018
JP    2019-204918 A   11/2019

OTHER PUBLICATIONS

Itoh et al., "A Digital Output Piezoelectric Accelerometer for Ultra-low Power Wireless Sensor Node," IEEE Sensors 2008 Conference (2008), pp. 542-545.

* cited by examiner

SENSOR MODULE

CROSS-REFERENCE TO RELATED APPLICATIONS

This application is based upon and claims the benefit of priority from the Japanese Patent Application No. 2019-048212, filed Mar. 15, 2019, the entire contents of which are incorporated herein by reference.

FIELD

Embodiments described herein relate generally to a sensor module.

BACKGROUND

Detecting frequency components and strength of abnormal vibration generated from equipment and machinery etc. and determining the abnormal parts and the extent of such are crucial in terms of securing safety and reliability of equipment and machinery, as well as assessing the necessity of performing maintenance. A small sensor module is desired in order to break down the constraints of the installation site. A small sensor module is difficult to be equipped with a large battery. Thus, a small sensor module needs to change its battery very frequently when the consumption power of the sensor module increases. Therefore, it is necessary to reduce the consumption power as much as possible for a sensor module that is required to operate for long hours.

DETAILED DESCRIPTION

In general, according to one embodiment, a sensor module includes at least one sensor and at least one switch. The sensor includes a first piezoelectric element. The first piezoelectric element includes a first electrode. The first piezoelectric element is set with a resonance frequency to resonate at a vibration frequency of a detection target. The switch includes a second piezoelectric element. The second piezoelectric element includes a second electrode connected to the first electrode and a third electrode electrically separated from the second electrode.

Hereinafter, embodiments will be described with reference to the drawings.

First Embodiment

Figure 1:
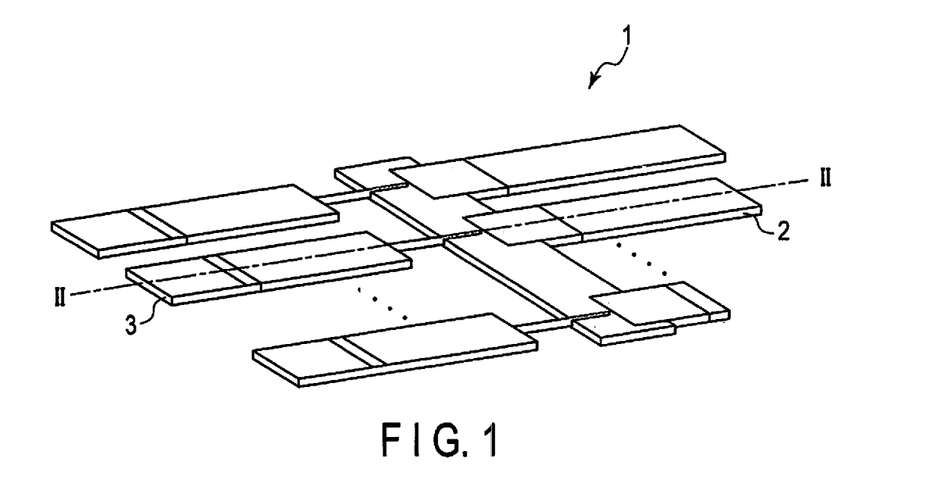
FIG. 1 is a diagram showing a configuration of one example of a sensor module according to a first embodiment.

FIG. 1 is a diagram showing a configuration of one example of a sensor module according to a first embodiment. The sensor module 1 comprises a sensor 2 and a switch 3. In addition, the sensor module 1 comprises a CMOS circuit not shown in FIG. 1. The sensor 2 and the switch 3 are provided in accordance with the number of vibrations constituting a detection target of the sensor module 1.

Figure 2A:
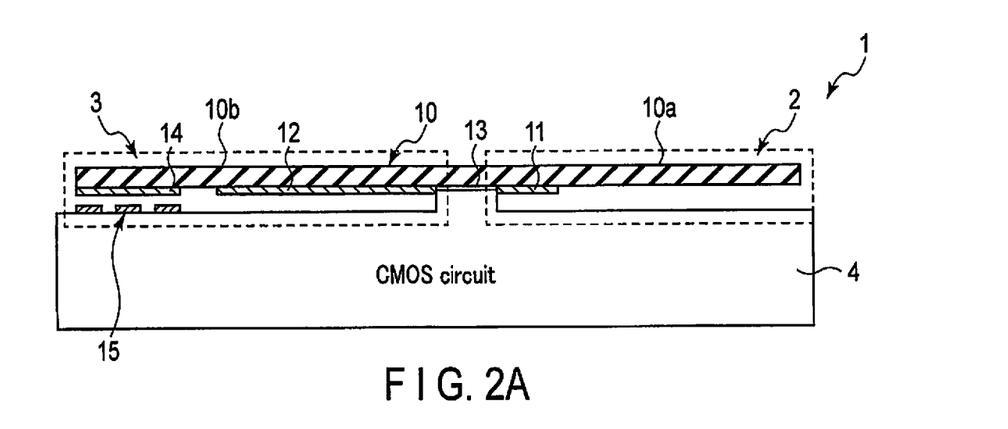
FIG. 2A is a cross-sectional view taken along line II-II of FIG. 1 when vibration is not generated at the sensor module.
Figure 2B:
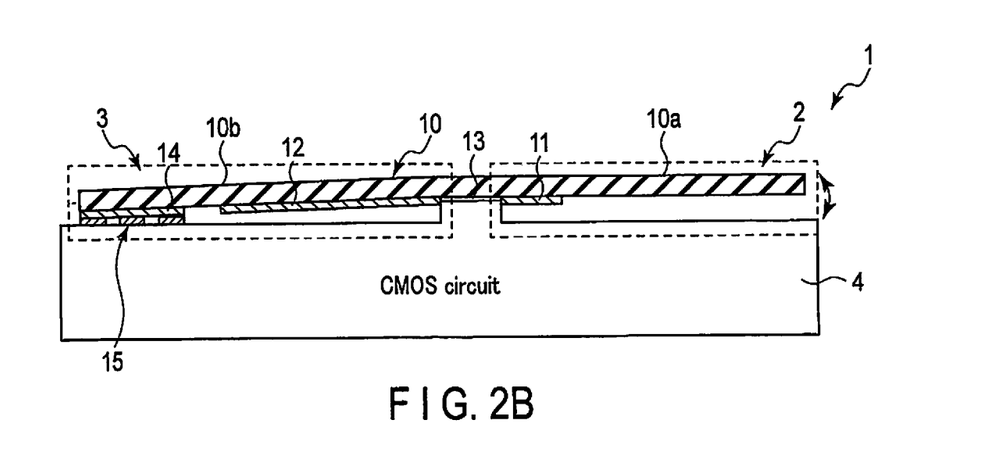
FIG. 2B is a cross-sectional view taken along line II-II of FIG. 1 when vibration is generated at the sensor module.

FIGS. 2A and 2B are cross-sectional views taken along line II-II of FIG. 1. FIG. 2A is a cross-sectional view of when vibration is not generated at the sensor module 1. FIG. 2B is a cross-sectional view of when vibration is generated at the sensor module 1.

As shown in FIG. 2A, the sensor 2 and the switch 3 share one piezoelectric element 10. The piezoelectric element 10 is, for example, a rectangular plate shaped piezoelectric element. A central part of the piezoelectric element 10 is fixed to a CMOS circuit 4. On the other hand, both ends of the piezoelectric element 10 are not fixed. The piezoelectric element 10 comprises two piezoelectric cantilevers 10a, 10b bordering on the central part. One of the piezoelectric cantilevers 10a, 10b does not have to be formed from the piezoelectric element. Namely, the cantilevers 10a, 10b can be formed from separate piezoelectric elements.

The sensor 2 is a piezoelectric sensor comprising one of the two cantilevers, i.e., the cantilever 10a and a sensing electrode 11.

The cantilever 10a is a piezoelectric cantilever where a resonance frequency is set to resonate at a vibration of the detection target prescribed for every sensor 2. The resonance frequency of the cantilever 10a can be set by, for example, setting a length for the central part to an end part. The cantilever 10a generates voltage by bending in accordance with the vibration of the resonance frequency.

The sensing electrode 11 is formed on a fixed end of the cantilever 10a. The sensing electrode 11 is an electrode for receiving voltage generated by the vibration of the cantilever 10a.

The switch 3 is a piezoelectric switch comprising one of the two cantilevers, i.e., the cantilever 10b, a drive electrode 12, a wiring 13 and a movable electrode 14.

The drive electrode 12 is formed on a fixed end of the cantilever 10b. The drive electrode 12 is electrically connected to the sensing electrode 11 and the wiring 13. The drive electrode 12 is an electrode for applying voltage applied from the sensing electrode 11, via the wiring 13, to the cantilever 10b. The cantilever 10b bends as shown in FIG. 2B depending on the voltage applied from the drive electrode 12.

The movable electrode 14 is separate from the drive electrode 12 and formed on the cantilever 10b. The movable electrode 14 is formed on the cantilever 10b so as to contact a fixed electrode 15 formed on the CMOS circuit 4 when the cantilever 10b bends, as shown in FIG. 2B.

Figure 3:
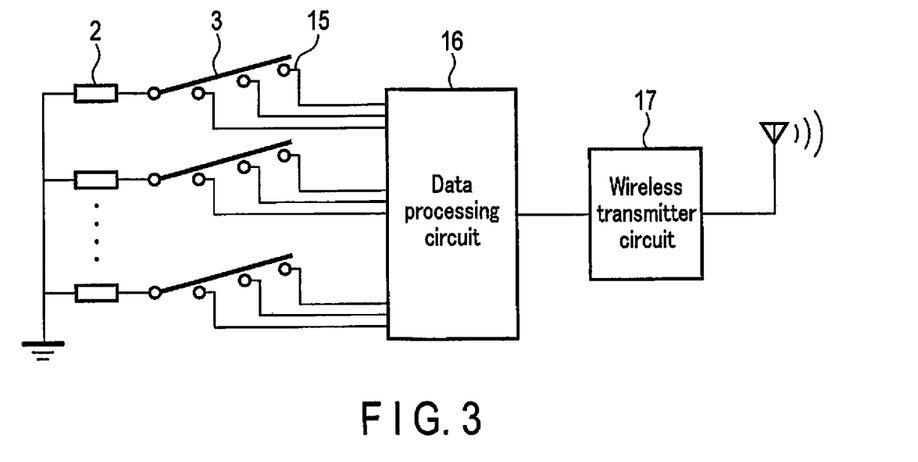
FIG. 3 is a block diagram showing a configuration of one example of a CMOS circuit.

The CMOS circuit 4 is a processing circuit that signal—processes vibrations sensed by the sensor 2. FIG. 3 is a block diagram showing a configuration of one example of the CMOS circuit 4. The CMOS circuit 4 comprises the fixed electrode 15, a data processing circuit 16 and a wireless transmitter circuit 17.

The fixed electrode 15 is provided to face the movable electrode 14. Multiple fixed electrodes 15 are provided for one switch 3. In FIG. 3, three fixed electrodes 15 are provided for one switch 3. The fixed electrode 15 is configured to be turned on for an extent of contact with the movable electrode 14, that is, a number in accordance with the bending extent of the cantilever 10b. The switch 3 and the fixed electrode 15 forms a MEMS switch.

The data processing circuit 16 extracts the frequency and strength of vibration generated in the sensor module 1 from the output of the fixed electrode 15. The vibration frequency is extracted depending on which sensor 2 of the corresponding fixed electrode 15 outputs the signal. In addition, the strength of the vibration is extracted according to how many signals are output by the fixed electrodes 15. The data processing circuit 16 can perform these extractions by the electric circuit. Further, the data processing circuit 16 includes CPU, ASIC, FPGA etc. and these extractions can be performed by a software. In addition, the data processing circuit 16 can perform extractions from the combination of hardware and software.

The wireless transmitter circuit 17 comprises an antenna. The wireless transmitter circuit 17 transmits the information of frequency and strength of vibration extracted by the data processing circuit 16 to the exterior of the sensor module 1, i.e. a server, at a constant interval. The wireless communication method of the wireless transmitter circuit 17 is not particularly limited.

The following explains the operation of the sensor module 1. When the sensor module 1 vibrates, the cantilever 10a of the sensor 2, having a resonance frequency close to the vibration frequency, bends. Herewith, the sensing electrode 11 generates a voltage. The voltage generated by the sensing electrode 11 is dependent on the bending of the cantilever 10a, in other words, the strength of added vibrations.

The voltage generated at the sensing electrode 11 is applied to the cantilever 10b via wiring 13 and drive electrode 12. Thus, the cantilever 10b bends. By the bending of the cantilever 10b, voltage is generated at the movable electrode 14.

When the cantilever 10b bends, the movable electrode 14 and the fixed electrode 15 come into contact. Thus, the signal from the fixed electrode 15 is output. When the bending of the cantilever 10b is small, in other words, when the applied vibration is small, the movable electrode 14 contacts one fixed electrode 15. When the bending of the cantilever 10b is of medium degree, in other words, when the applied vibration is of a medium degree, the movable electrode 14 contacts two fixed electrodes 15. Further, when the bending of the cantilever 10b is considerable, in other words, when a large vibration is applied, the movable electrode 14 contacts three fixed electrodes 15.

The data processing circuit 16 extracts the frequency and strength of vibration generated in the sensor module 1 from the output of the fixed electrode 15. As mentioned above, the vibration frequency is extracted depending on which sensor 2 of the corresponding fixed electrode 15 outputs the signal. In addition, the strength of the vibration is extracted according to how many signals are output by the fixed electrodes 15.

The wireless transmitter circuit 17 transmits information of frequency and strength of the vibration extracted by the data processing circuit 16 to the exterior of the sensor module, i.e. the server, at i.e. a constant interval. If the sensor module 1 is attached to a moving machine, the server determines whether abnormal vibrations are generated to the moving machine from the vibration frequency and strength transmitted from the wireless transmitter circuit 17.

As explained above, the present embodiment uses the sensor module combined with the piezoelectric sensor and the piezoelectric switch for detecting vibrations; an external power source is therefore not needed for driving the sensor. Further, there is no power consumption during the sensor operation and the switch operation.

The frequency components of a plurality of vibrations can be specified by providing a plurality of piezoelectric sensors with different resonance frequencies. Further, a plurality of different vibration frequencies can be specified at once. Thus, the sensor module 1 of the embodiment can be applied to vibrations having a wide range of frequencies. More specifically, the sensor module 1 can detect vibrations of various types of equipment or machines.

The switch uses a piezoelectric MEMS switch. The advantages of the piezoelectric MEMS switch are: achievement of both high precision 0 Hz/DC performance and wide band RF performance, and delivery of high reliability from the relay in a surface-mounted small form factor. Generally, the drive voltage of the piezoelectric MEMS switch is low compared to the electrostatic MEMS switch. In all kinds of switch techniques, the most important figure of merit is a value which multiplies an "on" resistance to an "off" capacitance of a single switch. Generally, this is called a RonCoff product and is represented in femtosecond units. The MEMS switch has a small RonCoff product compared to the CMOS switch. Thereby, the insertion loss of the switch will be smaller and "off" isolation will be improved.

In the present embodiment, the switch comprising the plurality of fixed electrodes, where the number switched on changes depending on the extent of contact with the moveable electrode, is provided. This structure allows for specification of the strength of abnormal vibration (for example, light, medium and heavy). The data processing circuit 16 outputs the on/off information of the switch as a signal. That is, the information concerning the strength of abnormal vibrations is output in the form of a digital signal. Thus, the electricity needed for A/D conversion of the wireless signal transmission is also unnecessary.

Second Embodiment

Figure 4:
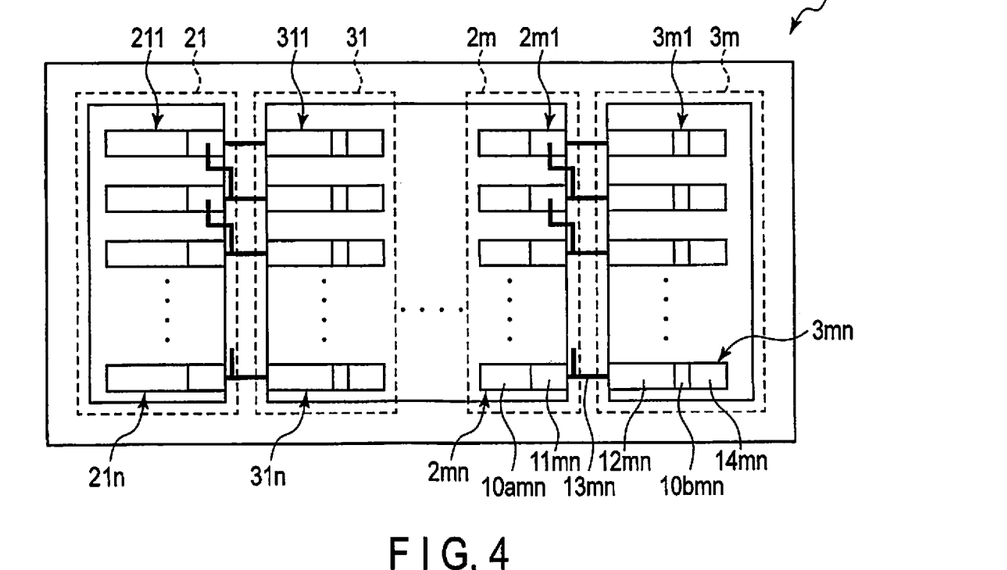
FIG. 4 is a diagram showing a configuration of a first example of a sensor module according to a second embodiment.

The following explains a second embodiment. FIG. 4 is a diagram showing a configuration of a first example of a sensor module according to a second embodiment. As shown in FIG. 4, a sensor module 1 of a first example comprises a plurality of sensor arrays $2m$ (m=1, 2 . . . ).

One sensor array $2m$ includes an n-number of sensors $2mn$ (m=1, 2 . . . , n=1, 2 . . . ). Each of the sensors $2mn$ is sensor where piezoelectric sensor having a cantilever $10amn$ and a piezoelectric sensor having a cantilever $10bmn$, similar to the first embodiment, are combined. Thus, in the second embodiment, resonance frequency of cantilever $10amn$ are set to be the same for every sensor array $2m$. Further, a sensing electrode $11mn$ (m=1, 2 . . . , n=1, 2 . . . ) of a sensor $2mn$ included in one sensor array $2m$ is electrically connected in series via a wiring $13mn$.

Each sensor $2mn$ is connected to a drive electrode $12mn$ (m=1, 2 . . . , n=1, 2 . . . ) formed on the cantilever $10bmn$ (m=1, 2 ..., n=1, 2 ...) of a corresponding switch 3mn (m=1, 2 ..., n=1, 2 ...) via the wiring 13mn (m=1, 2 ..., n=1, 2 ...). The cantilever 10bmn is further formed with a movable electrode 14mn.

In a first example of the second embodiment, a plurality of vibration frequency components can be specified when a power consumption of the sensor and the switch is zero, similar to the first embodiment. In the first example of the second embodiment, the sensing electrodes 11mn are connected in series. Thus, the voltage received at the sensing electrode 11mn included in one sensor array 2m is a sum of the voltages generated at each of the sensing electrodes 11mn. Thus, the vibrations applied to each sensor 2mn can be detected even if small. The detection accuracy of the size of the abnormal vibration is improved in the first example of the second embodiment.

Figure 5:
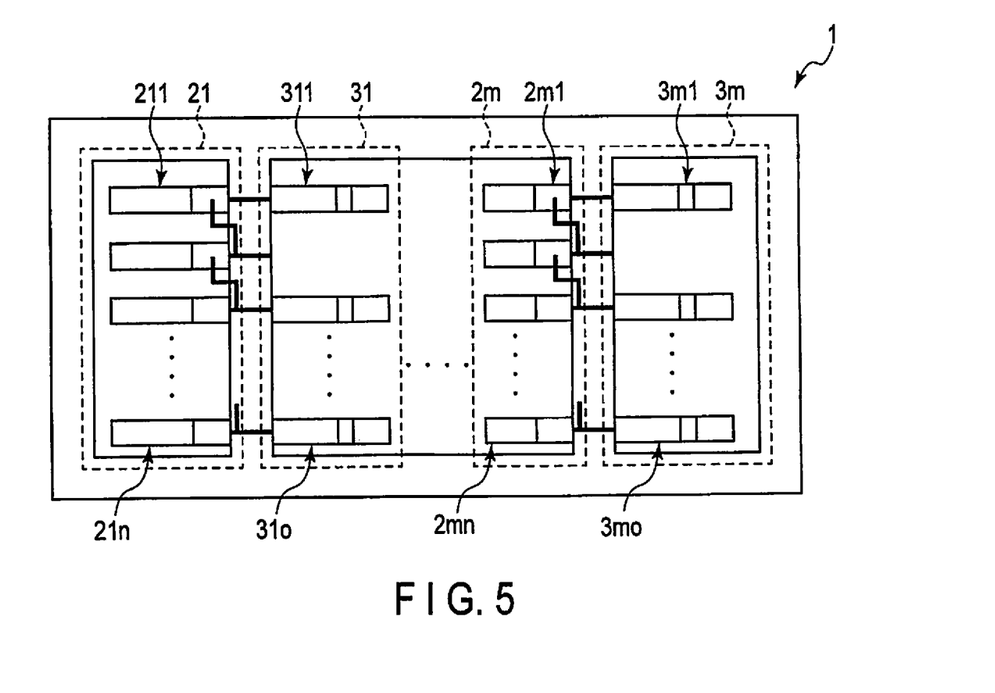
FIG. 5 is a diagram showing a configuration of a second example of the sensor module according to the second embodiment.

FIG. 5 is a diagram showing a configuration of a second example of the sensor module according to the second embodiment. As shown in FIG. 5, a piezoelectric sensor of the second example comprises a plurality of sensor arrays 2m (m=1, 2 ...). This point is similar to the first example.

In the second example, the sensor 2mn is connected to a switch 3mo (m=1, 2 ..., o=1, 3 ...) at a constant interval of sensor 2mn; in the drawings, it is a single interval. The interval is not limited to a single interval.

In the second example of the second embodiment, the detection accuracy of the size of the abnormal vibration is improved in a manner similar to that of the first example. The number of MEMS switches is reduced in the second example.

Third Embodiment

The following explains a third embodiment. The first embodiment and the second embodiment are configured by a cantilever where both the piezoelectric sensor and the piezoelectric switch have piezoelectric properties. In contrast, the piezoelectric sensor and the piezoelectric switch need not necessarily be configured by the cantilever.

Figure 6:
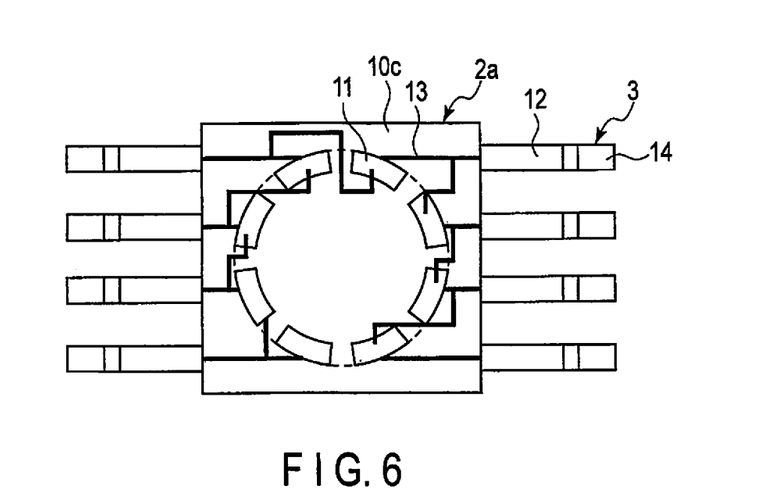
FIG. 6 is a diagram showing a configuration of a first example of a sensor module according to a third embodiment.

FIG. 6 is a diagram showing a configuration of a first example of a sensor module according to the third embodiment. FIG. 6 shows a configuration of one sensor array 2m of the sensor module 1 explained in the first example of the second embodiment. In FIG. 6, a membrane-type sensor 2a is used instead of an n-number of cantilever-type sensors of one sensor array 2m. A membrane 10c of the sensor 2a is formed with a divided n-number ring-shaped sensing electrode 11. Each of the sensing electrodes 11 is connected to a drive electrode 12 of a switch 3 via a wiring 13. In addition, each of the sensing electrodes 11 is connected in series via the wiring 13. On the other hand, switch 3 is a cantilever-type switch explained in the second embodiment. Thus, the switch 3 comprises a drive electrode 12 and a movable electrode 14.

Figure 7:
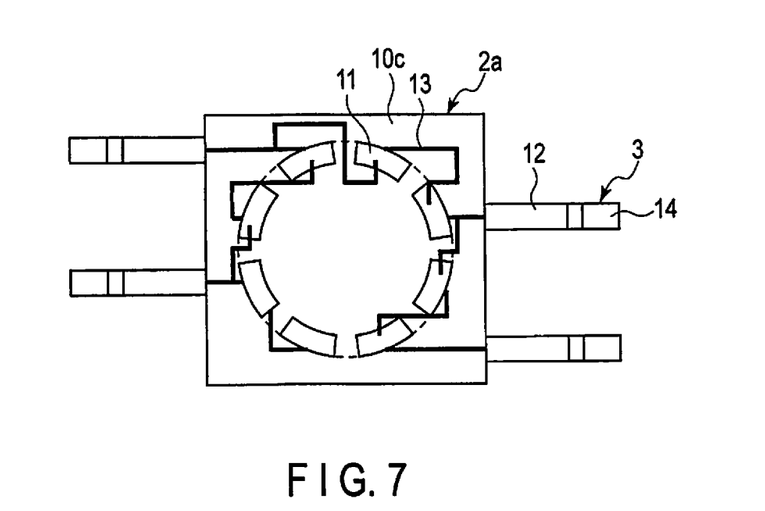
FIG. 7 is a diagram showing a configuration of a second example of the sensor module according to the third embodiment.

FIG. 7 is a diagram showing a configuration of a second example of a sensor module according to the third embodiment. FIG. 7 shows a configuration of one sensor array 2m of the sensor module 1 explained in the second example of the second embodiment. In FIG. 7, a membrane-type sensor 2a is used instead of an n-number of cantilever-type sensor of one sensor array 2m. A membrane 10c of the sensor 2a is formed with a separated n-number ring-shaped sensing electrode 11. In the second example, the sensing electrodes 11 are connected to the drive electrode 12 of the switch 3, via the wiring 13, at a constant interval. In addition, each of the sensing electrodes 11 is connected in series via the wiring 13. The switch 3 is a cantilever-type switch explained in the second embodiment. Thus, the switch 3 comprises a drive electrode 12 and a movable electrode 14.

Figure 8:
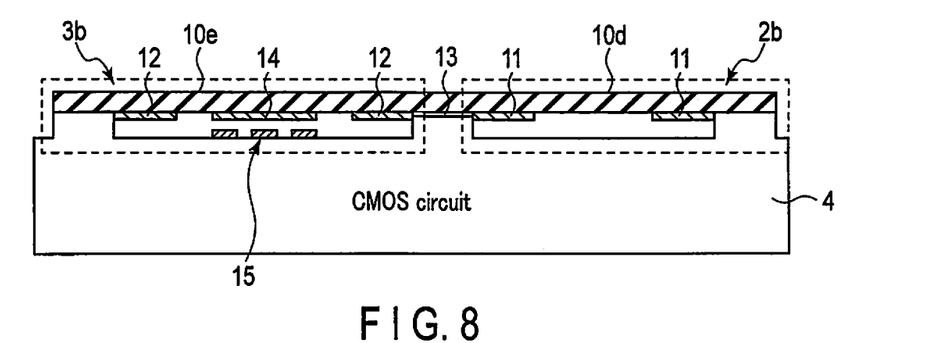
FIG. 8 is a diagram showing a configuration of a third example of the sensor module according to the third embodiment.

FIG. 8 is a diagram showing a configuration of a third example of the sensor module according to the third embodiment. The third example uses a double supported beam-type sensor 2b instead of the cantilever-type sensor 2. Both the ends of the sensor 2b are fixed and comprise a double supported beam 10d where a central part is not fixed. The sensing electrode 11 is formed on the fixed end of the double supported beam 10d. In FIG. 8, the double supported beam-type sensor 2b can be replaced with a membrane-type sensor.

The third example uses a double supported beam-type sensor 3b instead of the cantilever-type sensor 3. In switch 3b, both ends are fixed and comprise a double supported beam 10e where a central part is not fixed. The drive electrode 12 is formed on the fixed end of the double supported beam 10e. The drive electrode 12 is connected to the sensing electrode 11 via wiring 13. The movable electrode 14 is formed on the fixed end of the double supported beam 10e. In FIG. 8, the double supported beam-type sensor 3b can be replaced with a membrane-type sensor.

Figure 9:
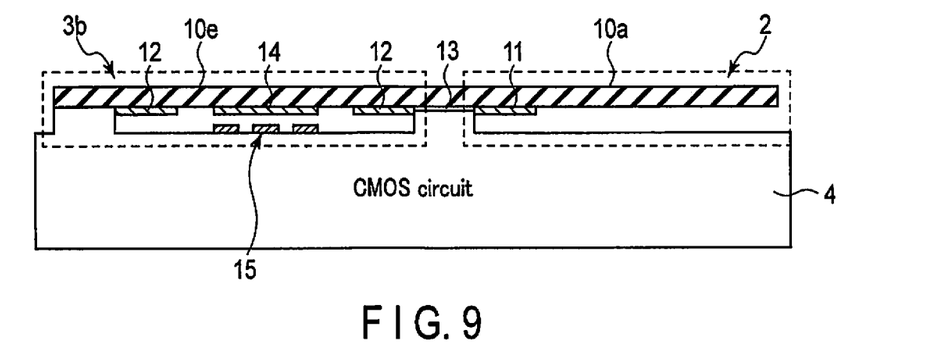
FIG. 9 is a diagram showing a configuration of a fourth example of the sensor module according to the third embodiment.

FIG. 9 is a diagram showing a configuration of a fourth example of a sensor module according to the third embodiment. In the fourth example, a piezoelectric sensor is a cantilever-type sensor 2. On the other hand, a piezoelectric switch is a double supported beam-type switch 3b in the fourth example.

Figure 10:
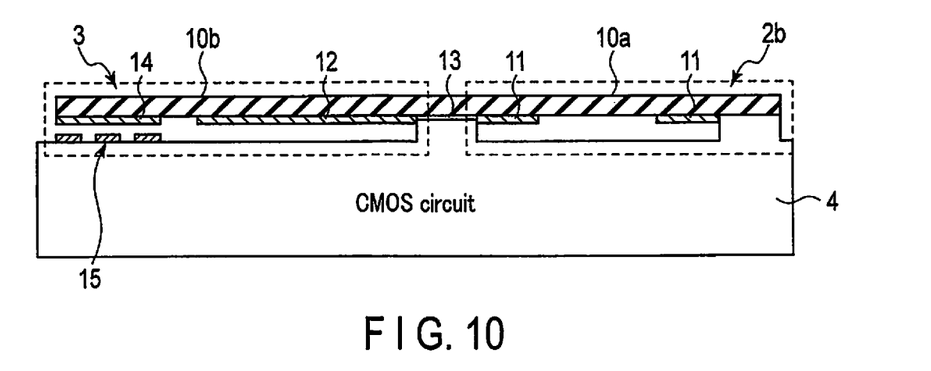
FIG. 10 is a diagram showing a configuration of a fifth example of the sensor module according to the third embodiment.

FIG. 10 is a diagram showing a configuration of a fifth example of a sensor module according to the third embodiment. In the fifth example, a piezoelectric sensor is a double supported beam-type sensor 2b. On the other hand, a piezoelectric switch is a cantilever-type switch 3 in the fifth example.

As explained above, the third embodiment employs an optional combination between a cantilever-type piezoelectric sensor, double supported beam-type piezoelectric sensor, membrane-type piezoelectric sensor and cantilever-type piezoelectric switch, a double supported beam-type piezoelectric switch, and membrane-type piezoelectric switch, and is able to achieve the same effect as the first embodiment and the second embodiment.

In the third embodiment, the fixed portions are not limited to two when a double supported beam or a membrane is used. That is, the fixed portions can be provided at a place other than the end portions. In the above structure, the sensing electrode and the drive electrode are provided at a fixed portion in the piezoelectric element. On the other hand, the movable electrode is provided at a non-fixed portion in the piezoelectric element.

Modification Example

The following explains a modification example. The shape of the piezoelectric element and the electrode in the above-mentioned embodiments are rectangular or ring-shaped. In contrast, the shape of the piezoelectric element and electrode can be an arbitrary shape other than a rectangular or ring shape.

In the aforementioned embodiments, the MEMS switch which utilizes the piezoelectric switch and a fixed electrode is used as the switch that receives the voltage of the piezoelectric sensor. In contrast, the switch that receives the voltage of the piezoelectric sensor can be replaced with other switches, i.e., electrostatic capacity switch or CMOS switch provided facing the piezoelectric switch. That is, the switch that receives the voltage of the piezoelectric sensor can be a switch that can output an output signal depending on an output voltage of the piezoelectric sensor.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A sensor module comprising:
   at least one sensor comprising a first piezoelectric element, the first piezoelectric element including a first electrode and set with a resonance frequency to resonate at a vibration frequency of a detection target; and
   at least one switch comprising a second piezoelectric element, the second piezoelectric element including a second electrode connected to the first electrode and a third electrode electrically separated from the second electrode,
   wherein the switch is operated in accordance with bending of the second piezoelectric element, and the bending occurs when a voltage generated at the first electrode by resonance of the first piezoelectric element is applied to the second piezoelectric element via the second electrode.

2. The sensor module according to claim 1, further comprising:
   a fourth electrode facing the third electrode,
   a data processing circuit configured to receive an output signal from the fourth electrode and extract a vibration frequency and strength applied to the sensor from the output signal, and
   a wireless transmitter circuit configured to wirelessly transmit information of the vibration frequency and strength extracted by the data processing circuit.

3. The sensor module according to claim 1, wherein the at least one sensor comprises a plurality of sensors comprising the respective first piezoelectric elements set with resonance frequencies to resonate at vibration frequencies of different detection targets, and
   the at least one switch comprises a plurality of switches corresponding to the respective sensors.

4. The sensor module according to claim 1, wherein the at least one sensor comprises a plurality of sensors forming a sensor array comprising the first piezoelectric elements configured to resonate at a same resonance frequency, and
   the first electrodes of the plurality of sensors included in the sensor array are connected in series.

5. The sensor module according to claim 1, wherein the at least one switch comprises a plurality of switches provided at a constant interval of the plurality of sensors included in the sensor array.

6. The sensor module according to claim 1, wherein the first piezoelectric element or the second piezoelectric element is of a cantilever shape.

7. The sensor module according to claim 1, wherein the first piezoelectric element or the second piezoelectric element is of a double supported beam shape.

8. The sensor module according to claim 1, wherein: the first piezoelectric element is of a membrane shape, and
   the first electrode is divided into a plurality of parts on the first piezoelectric element.

9. The sensor module according to claim 1, wherein the plurality of parts of the first electrode are connected in series, and
   the plurality of parts of the first electrode are connected to the second electrode at a constant interval.

10. The sensor module according to claim 1, further comprising:
    an electrostatic capacity switch facing the third electrode.

11. The sensor module according to claim 1, further comprising:
    a CMOS switch facing the third electrode.

* * * * *